United States Patent [19]

Chu

[11] Patent Number: 4,972,296
[45] Date of Patent: Nov. 20, 1990

[54] EXPANDABLE MODULAR SWITCHING UNIT

[75] Inventor: Pak-Jong Chu, Nepean, Canada

[73] Assignee: Northern Telecom Limited, Montreal, Canada

[21] Appl. No.: 366,760

[22] Filed: Jun. 15, 1989

[51] Int. Cl.$^5$ ............................................. H02B 1/04
[52] U.S. Cl. .................... 361/391; 211/41; 361/340; 361/395; 439/341
[58] Field of Search ............... 439/341, 350, 352, 357, 439/358; 211/41; 174/16.1; 361/304, 383, 390–395, 415, 417, 419

[56] References Cited

U.S. PATENT DOCUMENTS

| | | | |
|---|---|---|---|
| 2,899,669 | 8/1959 | Johanson | 439/341 |
| 3,617,985 | 11/1971 | Kehl | 439/341 |
| 4,313,150 | 1/1982 | Chu | 361/399 |
| 4,519,016 | 5/1985 | Bradley | 361/415 |
| 4,536,822 | 8/1985 | Osborne | 361/340 |
| 4,730,735 | 3/1988 | Lechner | 211/41 |
| 4,758,928 | 7/1988 | Wierec | 211/41 |
| 4,869,681 | 9/1989 | Vache | 439/341 |

FOREIGN PATENT DOCUMENTS 1124346 5/1982 Canada .

Primary Examiner—Gerald P. Tolin
Attorney, Agent, or Firm—Foley & Lardner, Schwartz, Jeffery, Schwaab, Mack, Blumenthal & Evans

[57] ABSTRACT

A cabinet for holding modules containing printed circuit boards and components within a module casing so that the modules are easily installed and removed. The cabinet, which is intended for mounting on a vertical surface, has a base with a transversely extending hinge pin mounted thereto, spaced outwardly from the base. Each module has on its lower end edge, adjacent its inner edge, a hinge pin receiving slot. A plurality of vertically oriented guiding walls extend outwardly from the base, and adjacent walls are spaced apart by a distance slightly greater than the thickness of a module to position a module being installed in a transverse direction. A guiding rib is located between each adjacent pair of guiding walls and extends outwardly from the base by a distance slightly less than the distance the hinge pin is spaced from the base whereby a module being installed is placed between appropriate guiding walls with the module corner defined by the inner edge and the lower end edge against the respective guiding rib. The module is then moved downwardly until the hinge pin receiving slot receives the hinge pin. The module is then rotated about the hinge pin like a lever until contacts on the module inner edge, which are connected with the circuitry on the printed circuit board therein, engage with contact members mounted on the base, which may be connected to external circuitry.

7 Claims, 3 Drawing Sheets

EXPANDABLE MODULAR SWITCHING UNIT

BACKGROUND OF THE INVENTION

This invention relates to a cabinet or housing which holds a number of modules or printed circuit boards in a manner that permits easy insertion and removal of the modules.

With the change of the market from telephone equipment purchased or rented from a telephone company to telephone equipment purchased from a manufacturer of telephone equipment and installed by the customer, there has been an increased demand for modular expandable equipment and systems. The cabinet and related equipment of this invention are particularly suited for such a system because they can provide a small or medium size switching unit that may be readily expanded or changed. The equipment of this invention may, of course, be easily adapted for use in computer systems or in any other system where it is desirable to expand or change the system to meet new requirements.

Hereinafter the term modules will be used and it is intended to include printed circuit boards with components mounted thereon, and printed circuit boards with components mounted thereon and sealed in plastic to form a block or mounted in a casing (with, of course, connecting contacts exposed).

It is known to have a cabinet with contacts on the inner side of the rear wall for engagement with contact members on any module. The modules may be disengaged or removed from the cabinet by gripping finger grips on an outer edge of the module and pulling outwards. A module is inserted by placing the contact members on the rear edge against the contacts on the rear wall and then pressing the module inwards towards the rear wall. Guide members or guide walls may be used to ensure the module is positioned with its contacts against appropriate contact members. It usually requires two hands to conveniently insert or withdraw a module, with one hand at the top and one hand at the bottom of the exposed side of the module.

The contact members or connectors on the module which engage and grip the contacts in the cabinet normally have a considerable spring bias to ensure good and reliable contact is made.

Good contact is, of course, essential. However a large spring bias frequently makes it difficult to engage manually the contact members of a module and the corresponding contacts of a cabinet. A number of means have been devised to provide some form of force to assist in the insertion and removal of a module. One such arrangement is described, for example, in Canadian Patent No. 1,124,346— Jordan, issued May 25, 1982, where a pivoted lever on a faceplate or cover plate engages a slot in the cabinet to press the printed circuit board inwardly or outwardly. This arrangement adds considerable structure to the cabinet and board.

Another arrangement is described in U.S. Pat. No. 4,313,150— Chu, issued Jan. 26, 1982. This arrangement comprises printed circuit boards with a pivoted lever at both the top and bottom of the exposed edge of the board. The structure may be less complex than that described in the aforementioned Jordan patent, but insertion and withdrawal requires two hands.

SUMMARY OF THE INVENTION

The cabinet and the modules of this invention use a pivotal movement for inserting and withdrawing a module. Each module has at one corner a slot or recessed bearing surface for receiving a pivot pin or hinge pin. The module is inserted and guided towards the pin so that the slot moves over the pin. Then the module is rotated around the pin until contact members at the rear edge of the module engage contacts within the cabinet. When the module is rotated about the pin, it acts as a lever. No complex arrangements are required to press the contacts into the contact members. The hinge pin locates the module longitudinally and guide members on the rear cabinet wall locate the module in a transverse direction to align the contacts with the contact members. The insertion and withdrawal is essentially a one-handed operation. The pivot pin locates the module longitudinally and guide members on the rear cabinet wall locate the module in a transverse direction to align the contacts with the contact members. The insertion and withdrawl is essentially a one-handed operation.

It is therefore an object of the invention to provide a module mounting cabinet and modules having in one corner a pivot pin receiving slot whereby a module may be positioned with the slot over the pivot pin in the cabinet and the module rotated about the pivot pin to engage contacts on the module with contact members in the cabinet.

It is therefore an object of the invention to provide a module mounting cabinet and modules having in one corner a hinge pin receiving slot whereby a module may be positioned with the slot over a hinge pin in the cabinet and the module rotated about the hinge pin to engage contacts on the module with contact members in the cabinet.

It is another object of the invention to provide a combination of a module and a cabinet where the module is mounted in the cabinet by positioning the module and rotating it.

Accordingly there is provided a cabinet for an expandable electronic system for removably mounting modules having circuitry for connection with the system, comprising a base member in the cabinet, a transversely extending hinge means mounted to the base and spaced outwardly therefrom, at least one module having an inner edge, an outer edge and first and second end edges, the module having circuitry therein, the module having on the first end edge adjacent the inner edge a hinge means receiving slot, and first contact means on the inner edge of the module adjacent the second end edge connected with the circuitry of the module, and mating second contact means on the base member for interconnection with the electronic system, the module being adapted to receive the hinge means in the hinge means receiving slot and to be rotated about the hinge means to engage the first contact means with the second contact means.

BRIEF DESCRIPTION OF THE DRAWINGS

The invention will be described with reference to the accompanying drawings, in which.

DETAILED DESCRIPTION OF THE PREFERRED EMBODIMENTS

Figures 1, 2:
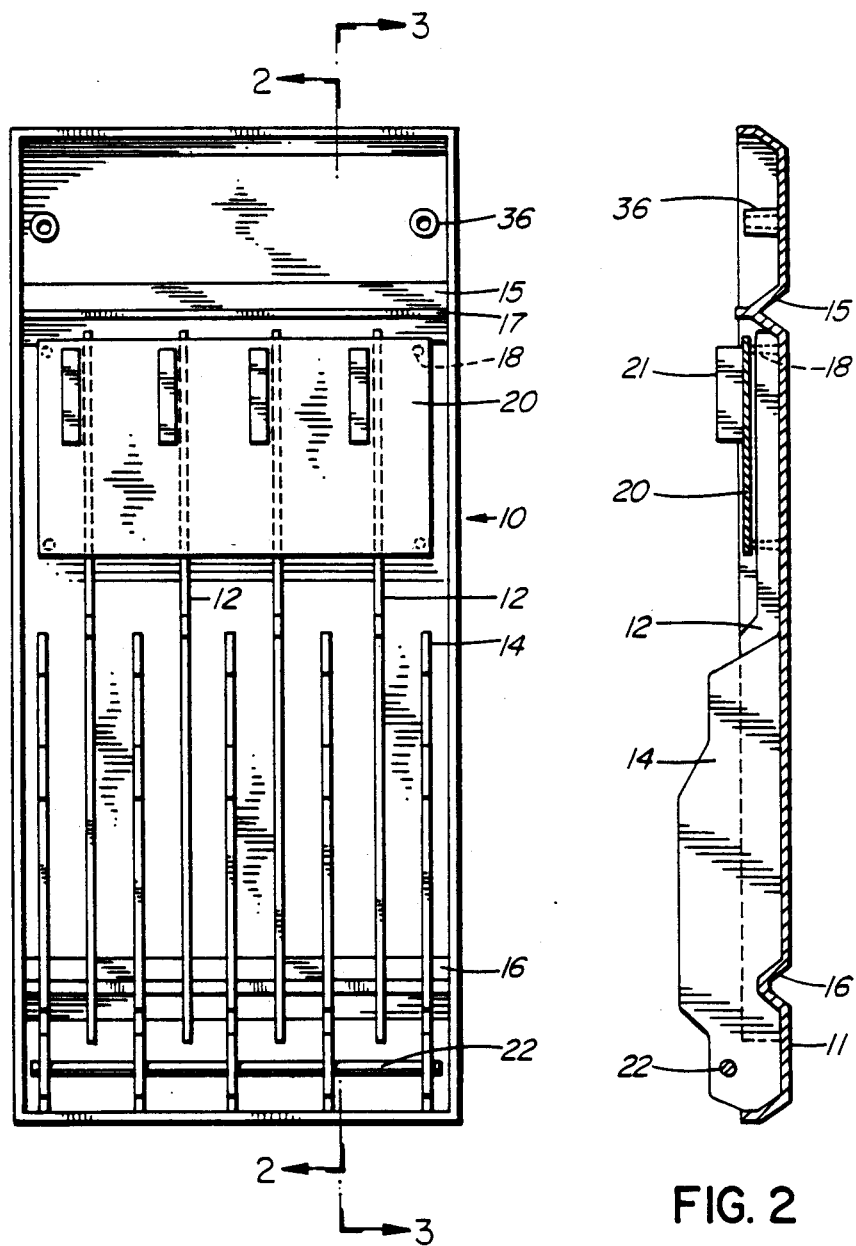
FIG. 1 is a front view of a cabinet according to the invention.
FIG. 2 is a sectional view taken on line 2—2 of FIG. 1.

Referring first to FIGS. 1 and 2, there is shown a front view and a sectional side view of a housing or cabinet 10 according to the invention. A rear portion or base 11 may conveniently be injection molded with spaced guiding ribs 12 and spaced guiding walls 14. Each guiding rib 12 is located substantially midway, in a transverse direction, between an adjacent pair of partitioning or guiding walls 14. Each adjacent pair of guiding walls 14 is spaced apart by a distance slightly greater than the width of a module (to be described subsequently) which mounts between them.

The base 11 has two strengthening regions 15 and 16 which are transversely extending, generally V-shaped, deformations in the base 11. The inwardly extending peak of the strengthening region 15 has a transversely extending supporting bar 17. Mounted to base 11 on lugs 18 is a distribution printed circuit board 20. Printed circuit board 20 has circuitry for interconnecting the contacts or pins (not shown) in connector pin header 21 and for making connections to external wiring of an electronic system (not shown). A hinge pin or pivot pin 22 extends transversely between guiding walls 14. The connector pin headers 21 are preferably mounted as far from the hinge pin 22 as is conveniently possible as will subsequently be explained.

Figure 3:
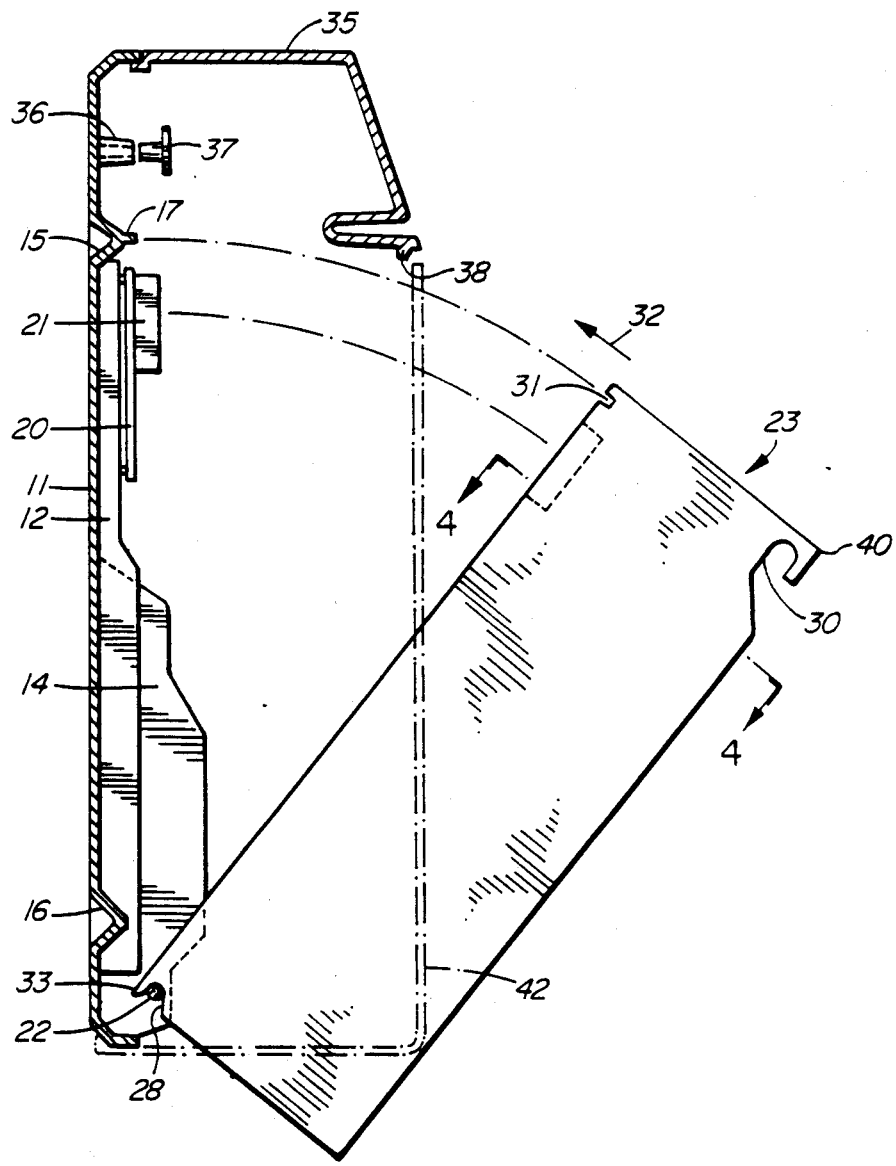
FIG. 3 is a sectional view taken on line 3—3 of FIG. 1 with a top cover shown in section and with a module positioned for rotation.
Figure 4A:
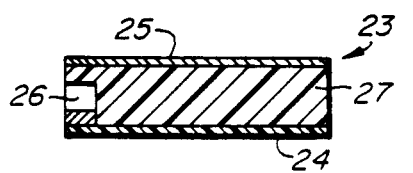
FIGS. 4A and 4B are sectional views of two forms of module each taken on line 4—4 of FIG. 3.
Figure 4B:
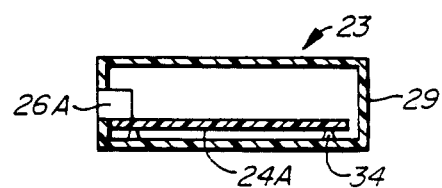

Referring now to FIG. 3, a cross-sectional view of base 11 is shown with a module 23. In FIGS. 4A and 4B there are shown cross-sectional views of different forms of module 23. In FIG. 4A module 23 is shown as a printed circuit board 24 on which various electrical components (not shown) may be mounted, and a cover board 25 spaced from printed circuit board 24 to provide space for the components. The printed circuit board 24 and the cover board 25 form a protected circuit pad or sandwich conveniently filled with a plastic material 27, such as a foamed plastic material.

A connector receptacle 26 is mounted in the module 23 and has contact members (not shown) which are connected to the circuitry of printed circuit board 24. The connector receptacle 26 may, of course, be positioned at any desired place between the printed circuit board 24 and the cover board 25 so that it will engage the connector pin header 21. The connector receptacle 26 is at the edge of module 23 with the contact members which it contains exposed. The module 23 has a curved recess or slot 28 for receiving hinge pin 22, and a recess or indentation 30 which forms a finger grip. Module 23 also has a supporting slot 31 which is shaped to conform to supporting bar 17.

In FIG. 4B, a split casing 29 encloses a printed circuit board 24A with a connector receptacle 26A mounted therein. The printed circuit board 24A may be fastened to casing 29 using screws (not shown) into raised positioning areas 34.

It will be apparent from FIG. 3 how the module 23 is installed. First, the module 23 is positioned with a corner 33 (adjacent slot 28) against the appropriate guiding rib 12 and between the appropriate pair of partitioning or guiding walls 14. The module 23 is then moved downwardly along the guiding rib 12 until slot 28 engages hinge pin 22. Then the module 23 is rotated about hinge pin 22, as indicated by arrow 32, until connector receptacle 26 mates with connector pin header 21 and the contact members in connector receptacle 26 engage the contacts or pins in connector pin header 21. As the contacts and contact members become fully engaged, the supporting bar 17 engages the supporting slot 31 first to provide additional support and second to provide a stop.

As is indicated in FIG. 3, a top cover may be mounted to base 11 using screws (not shown) through cover mounting studs 36 in base 11 and into screw receiving member 37 in cover 35. Top cover 35 has a latching hook 38 for each module, arranged to hook or latch the corner 40 of a respective module 23 to secure it in its mounted position.

A module 23 may be removed by raising the latching hook 38, gripping the finger grip 30, rotating the module 23 about hinge pin 22, and lifting the module 23 off the hinge pin 22. This is a simple single-handed operation.

Figure 5:
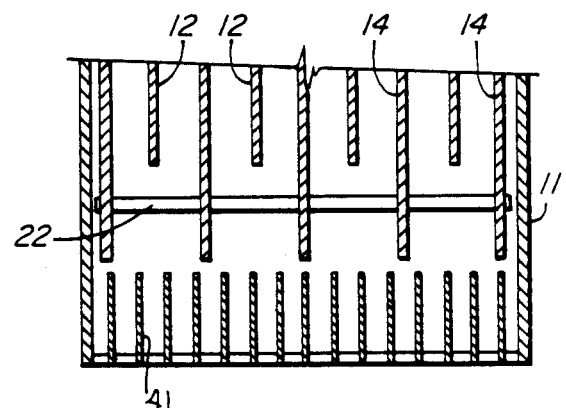
FIG. 5 is a partial sectional front view of the lower portion of a base of a cabinet of another form of the invention.

Referring now to FIG. 5, there is shown a sectional front view of a lower part of base 11 with partitioning or guiding walls 14 and guiding ribs 12. This form of base 11 is open at the bottom and has parallel air directing members 41 for directing air flow upwardly past the modules 23 for cooling. The air directing members 41 in base 11 are useful when a cover is installed, such as is indicated in FIG. 3 by broken lines, as cover 42.

Figure 6:
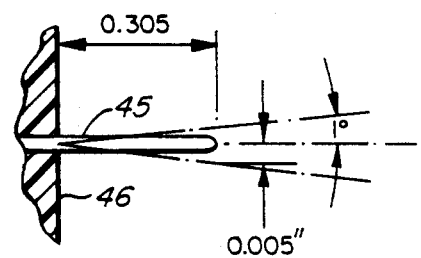
FIG. 6 is a sectional view showing a single pin of a pin header.

It was previously indicated that the pin header 21 should be mounted as far as conveniently possible from hinge pin 22. There is, in fact, a minimum distance that is acceptable between hinge pin 22 and the nearest pin in pin header 21, and this distance depends on the length and permissible amount of bending or flexing of the pins in pin header 21. By way of example, one standard in use at present requires a pin length of 0.305 inch above the header base or printed circuit in which the pin is mounted. This standard provides that the pin shall be capable of bending or flexing by plus or minus one degree. This is approximately equivalent to plus or minus 0.005 inch deflection at the pin tip. This is illustrated in FIG. 6 where a pin 45 is shown mounted in and projecting from a pin header base 46. This standard, which is used as an example only, will require certain restrictions in the design. This will become clear with reference to FIG. 7.

Figure 7:
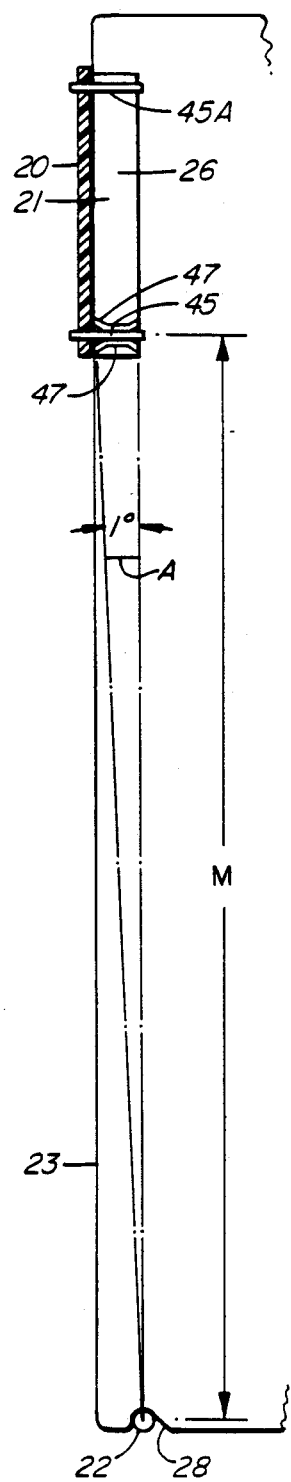
FIG. 7 shows portions of a module mounted in a cabinet and useful in describing the invention.

Referring to FIG. 7, there is shown in abbreviated form, a distribution printed circuit board 20 in section, with a pin header 21 having shown two pins 45 and 45A. It will be apparent that there are normally a greater number of pins in a pin header but only two are shown for simplicity. A module 23 is indicated in partial outline as it would be positioned when inserted or mounted with hinge pin 22 within slot 28. The connector receptacle 26 has received the pin header 21 and the pins in pin header 21 have been gripped or contacted by the contact members 47 (only one pair of contact members 47 are shown for ease of drawing and this pair are in engagement with pin 45) in connector receptacle 26.

It will be apparent that the rotation of module 23 about hinge pin 22 when the module is being inserted or mounted, will cause a flexing or bending or tilting of each pin in pin header 21. This is because the module 23 and the connector receptacle 26 follow an arc when the module is rotated into engagement. The pin 45, that is the pin in pin header 21 closest to hinge pin 22, is the critical pin as it will be tilted or bent by the greatest amount. The distance M between the center of hinge pin 22 and pin 45 will determine the amount by which pin 45 will be tilted or bent. It can be calculated that a distance M of 18 inches would provide an angle A of one degree, and this would limit the tilting or bending of pin 45 to one degree. It should be noted that hinge pin 22 is spaced outwardly from base 11 (FIGS. 2 and 3) by a distance which will place the hinge pin 22 in a neutral position, that is, will place hinge pin 22 in a plane defined by the ends of pins 45 in pin header 21. In the example given above, this would be of the order of 0.305 inch from the plane defined by distribution printed circuit board 20. Also, slot 28 in module 23 is located so that it will permit the connector receptacle 26, and the adjacent module edge, to abut the printed circuit board 20 with the inner module edge substantially in a plane defined by the surface of printed circuit board 20.

It will be apparent that other standards for the pins in pin header 21, which specified shorter pin lengths or permitted greater bending or tilting of the pins, would reduce the distance M in FIG. 7.

It will be seen that the invention provides for a system incorporating a cabinet and modules where the modules are readily added or removed to expand or change the system. The lever action of the rotating module provides an adequate force to overcome any resistance caused by spring forces in the engagement of contact and contact members when a module is being installed in the cabinet or withdrawn from the cabinet. The modules are firmly supported and latched in place. The withdrawing or inserting normally is a single-handed operation.

I claim:

1. In combination, a cabinet for vertical mounting, said cabinet having a base member and modules removably mounted in said cabinet, comprising
   a hinge pin mounted to said base member, extending in a direction transverse of said base member and spaced outwardly therefrom,
   a distribution printed circuit board mounted to said base member, spaced from said hinge pin at right angles to said transverse direction, and having means for connection to external circuitry,
   at least one module having a thickness defined by first and second sides and having an inner edge, an outer edge, and first and second end edges, said at least one module having on said first end edge adjacent said inner edge a hinge pin receiving slot,
   a connector receptacle on said at least one module at said inner edge adjacent said second end edge having contact members interconnected with circuitry in said at least one module,
   a connector pin header for each said module, mounted to said distribution printed circuit board and having contact pins therein interconnected with circuitry on said board,
   partitioning walls extending outwardly from said base member, spaced apart by a distance slightly greater than the thickness of said at least one module, and extending in a direction at right angles to said transverse direction for guiding a module into a desired transverse mounting position, and
   a guiding rib between adjacent partitioning walls, extending outwardly from said base member a distance slightly less than the outward spacing of said hinge pin from said base member for guiding the corner of said at least one module defined by said first end edge and said inner edge along said guiding rib whereby said hinge pin receiving slot receives said hinge pin and rotation of said module about said hinge pin engages respective contact pins with respective contact members.

2. The invention defined in claim 1 and further comprising a top cover mounted to said base member and extending outwardly from said base member and downwardly and terminating in a plurality of latching hooks, there being one latching hook for each module in said cabinet, each said latching hook being in engagement with a respective module at the corner thereof defined by said outer edge and said second end edge and respective contact pins engaging with respective contact members.

3. The invention as defined in claim 1 and further comprising
   a plurality of spaced apart, parallel, air directing members incorporated in said base member at the lower end thereof, said base member being open to atmosphere between said air directing members, for directing the flow of air towards each said module.

4. The invention as defined in claim 1 wherein said contact pins have extermities defining a plane, said hinge pin lies in said plane and said hinge pin receiving slot is spaced from said inner edge by a distance which places the inner edge substantially in a second plane defined by said distribution printed circuit board.

5. The invention as defined in claim 4 in which the nearest contact pin in said pin header is spaced from said hinge pin by a distance which is sufficient to avoid bending said contact pins beyond their bending limitation.

6. The invention as defined in claims 1, 2 or 3 wherein each said module further comprises a printed circuit board having said circuitry thereon and components mounted thereon, and an outer casing enclosing said printed circuit board and said components except for said contact members in said connector receptacle.

7. In combination, a cabinet for vertical mounting, said cabinet having a base member and modules removably mounted in said cabinet, comprising
   a hinge pin mounted to said base member, extending in a direction transverse of said base member and spaced outwardly therefrom,
   a distribution printed circuit board mounted to said base member, spaced from said hinge pin at right angles to said transverse direction, and having means for connection to external circuitry,
   at least one module having a thickness defined by first and second sides and having an inner edge, an outer edge, and first and second end edges, said at least one module having on said first end edge adjacent said inner edge a hinge pin receiving slot,
   a connector receptacle on said at least one module at said inner edge adjacent said second end edge having contact members interconnected with circuitry in said at least one module,
   a connector pin header for each said module, mounted to said distribution printed circuit board at a point on the printed circuit board remote from said hinge pin, said pin header having contact pins therein interconnected with circuitry on said board, said contact pins having extremities defining a plane, said hinge pin lying in said plane and said hinge pin receiving slot being spaced from said inner edge by a distance placing said inner edge substantially in a second plane defined by said distribution printed circuit board, the contact pin in said pin header nearest said hinge pin being spaced from said hinge pin by a distance sufficient to avoid bending said contact pins beyond their bending limitation.

* * * * *